United States Patent
Kwon

(10) Patent No.: US 9,773,569 B2
(45) Date of Patent: Sep. 26, 2017

(54) STACK TYPE SEMICONDUCTOR MEMORY AND SEMICONDUCTOR SYSTEM USING THE SAME

(71) Applicant: SK hynix Inc., Icheon-si Gyeonggi-do (KR)

(72) Inventor: Ki Hun Kwon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/048,016

(22) Filed: Feb. 19, 2016

(65) Prior Publication Data

US 2017/0133103 A1    May 11, 2017

(30) Foreign Application Priority Data

Nov. 5, 2015 (KR) .................. 10-2015-0154998

(51) Int. Cl.
| | |
|---|---|
| *G11C 29/12* | (2006.01) |
| *G11C 5/06* | (2006.01) |
| *G11C 7/10* | (2006.01) |
| *G11C 8/10* | (2006.01) |
| *G11C 29/26* | (2006.01) |
| *H01L 23/48* | (2006.01) |
| *H01L 25/065* | (2006.01) |
| *G11C 5/02* | (2006.01) |
| *G11C 29/18* | (2006.01) |

(Continued)

(52) U.S. Cl.
CPC .......... *G11C 29/1201* (2013.01); *G11C 5/025* (2013.01); *G11C 5/063* (2013.01); *G11C 7/10* (2013.01); *G11C 8/10* (2013.01); *G11C 29/18* (2013.01); *G11C 29/26* (2013.01); *G11C 29/46* (2013.01); *H01L 23/481* (2013.01); *H01L 25/0657* (2013.01); *G11C 8/12* (2013.01); *G11C 2029/1206* (2013.01); *G11C 2029/1802* (2013.01); *H01L 2225/06541* (2013.01)

(58) Field of Classification Search
CPC ......... G11C 29/1201; G11C 8/10; G11C 7/10; G11C 5/063; G11C 29/26; G11C 2029/1206; H01L 25/0657; H01L 23/481; H01L 2225/06541
See application file for complete search history.

(56) References Cited

U.S. PATENT DOCUMENTS

| | | | | |
|---|---|---|---|---|
| 9,389,945 | B1* | 7/2016 | Press | G01R 31/3177 |
| 2012/0262196 | A1* | 10/2012 | Yokou | G01R 31/318513 |
| | | | | 324/750.3 |

(Continued)

FOREIGN PATENT DOCUMENTS

KR    1020070103840 A    10/2007

*Primary Examiner* — Harry W Byrne
*Assistant Examiner* — Ajay Ojha
(74) *Attorney, Agent, or Firm* — William Park & Associates Ltd.

(57) ABSTRACT

A stack type semiconductor memory includes a plurality of stacked dies configured to transmit signals through a plurality of through electrodes. Any one die of the plurality of stacked dies is configured to provide preliminary test mode signals to other dies through the plurality of through electrodes, and the other dies are configured to generate test mode signals according to the preliminary test mode signals transmitted through the plurality of through electrodes.

18 Claims, 4 Drawing Sheets

(51) Int. Cl.
*G11C 29/46* (2006.01)
*G11C 8/12* (2006.01)

(56) References Cited

U.S. PATENT DOCUMENTS

| | | | | |
|---|---|---|---|---|
| 2012/0324305 | A1* | 12/2012 | Whetsel | G01R 31/318538 714/733 |
| 2013/0024737 | A1* | 1/2013 | Marinissen | G01R 31/318508 714/727 |
| 2015/0016172 | A1* | 1/2015 | Loh | G11C 5/02 365/51 |

* cited by examiner

STACK TYPE SEMICONDUCTOR MEMORY AND SEMICONDUCTOR SYSTEM USING THE SAME

CROSS-REFERENCES TO RELATED APPLICATION

This application claims priority under 35 U.S.C. 119(a) to Korean application No. 10-2015-0154998, filed on Nov. 5, 2015, in the Korean intellectual property Office, which is incorporated by reference in its entirety as set forth in full.

BACKGROUND

1. Technical Field

The inventive concept relates to a semiconductor integrated circuit, and more particularly, to a stack type semiconductor memory and a semiconductor system using the same.

2. Related Art

Testing processes are inevitably performed to determine whether or not semiconductor devices operate normally.

The semiconductor devices may include circuit configurations for test. The circuit configuration for test may perform corresponding test operations according to external control or internal control, and determine PASS or FAIL internally according to a test result or determine PASS or FAIL through external monitoring.

The semiconductor devices may be configured to transmit and receive signals between a plurality of chips through electrodes by stacking the plurality of chips to improve a degree of integration.

Stack type semiconductor memories have to be designed to efficiently transmit signals for input test operation control from the outside using a minimum sized through electrode.

SUMMARY

One or more exemplary embodiments are provided to a stack type semiconductor memory capable of efficiently transferring external input signals for test operation control using a minimum through electrode and a semiconductor system including the same.

According to an embodiment, there is provided a stack type semiconductor memory. The stack type semiconductor memory may include a plurality of dies stacked configured to transmit signals through a plurality of through electrodes. Any one die of the plurality of stacked dies may be configured to provide preliminary test mode signals to other dies through the plurality of through electrodes, and the other dies may be configured to generate test mode signals according to the preliminary test mode signals transmitted through the plurality of through electrodes.

According to an embodiment, there is provided a stack type semiconductor memory. The stack type semiconductor memory may include a base die and a core die stacked configured to transmit signals through a plurality of through electrodes. The base die may be configured to transmit preliminary test mode signals, which are generated by decoding source signals for test mode setup input through a direct access electrode region or a physical region, to the core die through the plurality of through electrodes, and the core die may be configured to generate test mode signals according to the preliminary test mode signals transmitted through the plurality of through electrodes and allow a test mode corresponding to the test mode signals to be set.

According to an embodiment, there is provided a semiconductor system may include a memory controller; and a stack type semiconductor memory coupled to the memory controller through an interposer and including a plurality of dies. Any one die among the plurality of dies may be configured to transmit preliminary test mode signals, which are generated by decoding source signals for test mode setup input through a direct access electrode region or a physical region, to other dies among the plurality of dies through the plurality of through electrodes, and the other dies may be configured to generate test mode signals according to the preliminary test mode signals transmitted through the plurality of through electrodes and allow a test mode corresponding to the test mode signals to be set.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
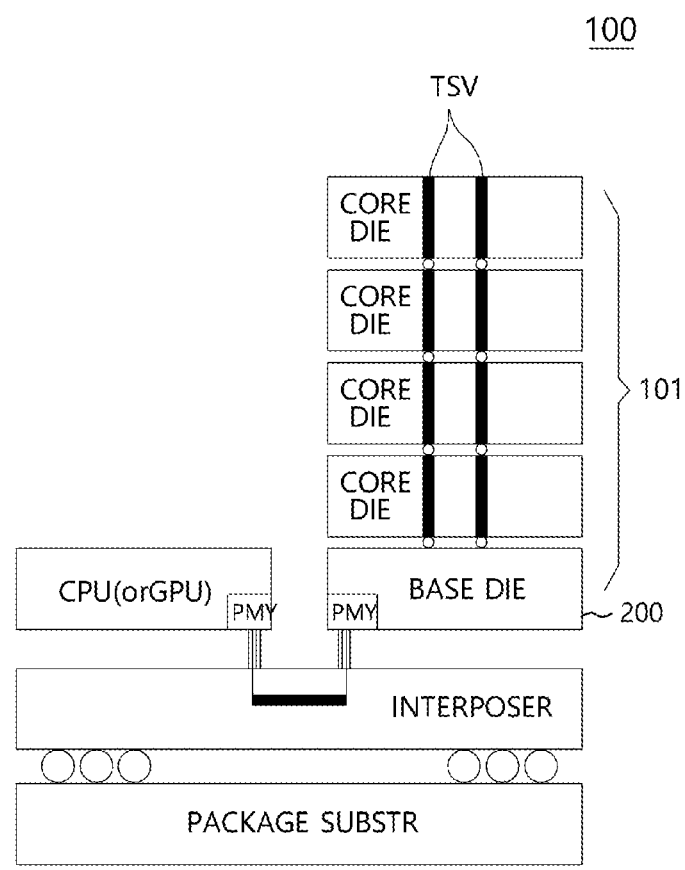
FIG. 1 is a view illustrating a configuration of a semiconductor system according to an embodiment of the inventive concept.

One or more example embodiments are provided to a stack type semiconductor memory capable of efficiently transferring external input signals for a test operation control using a minimum number of through electrodes and a semiconductor system including the same.

Hereinafter, example embodiments will be described in greater detail with reference to the accompanying drawings. Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, the layer can be directly on the other or substrate, or intervening layers may also be present.

The inventive concept is described herein with reference to cross-section and/or plan illustrations that are schematic illustrations of idealized embodiments of the inventive concept. However, embodiments of the inventive concept should not be construed as limited to the disclosed inventive concept. Although a few embodiments of the inventive concept will be shown and described, it will be appreciated by those of ordinary skill in the art that changes may be made in these example embodiments without departing from the principles and spirit of the inventive concept.

A semiconductor system 100 according to an embodiment may be implemented in the form of a system in package, a multi-chip package, a system on chip, and the like. The semiconductor system 100 may be implemented in a form of a package on package including a plurality of packages.

As illustrated in FIG. 1, the semiconductor system 100 according to an embodiment may include a stack type semiconductor memory 101, a memory controller (for example, central processing unit (CPU) or graphic processing unit (GPU)), an interposer, and a package substrate.

The stack type semiconductor memory 101 may be configured in the form of a high bandwidth memory of which the number of input/output (I/O) units is increased, and a bandwidth is improved by stacking a plurality of dies and electrically coupling the plurality of dies through through electrodes.

The interposer may be arranged on the package substrate and coupled thereto.

The stack type semiconductor memory 101 and the memory controller CPU or GPU may be arranged on the interposer and coupled thereto.

Physical regions PHY of the stack type semiconductor memory 101 and the memory controller CPU or GPU may be coupled to each other through the interposer.

The stack type semiconductor memory 101 may be configured with a plurality of stacked dies.

The plurality of dies may include a base die 200 and a plurality of core dies 300.

The base die 200 and the plurality of core dies 300 may be electrically coupled and configured to transmit signals through the through electrodes, for example, through silicon vias (TSVs).

Figure 2:
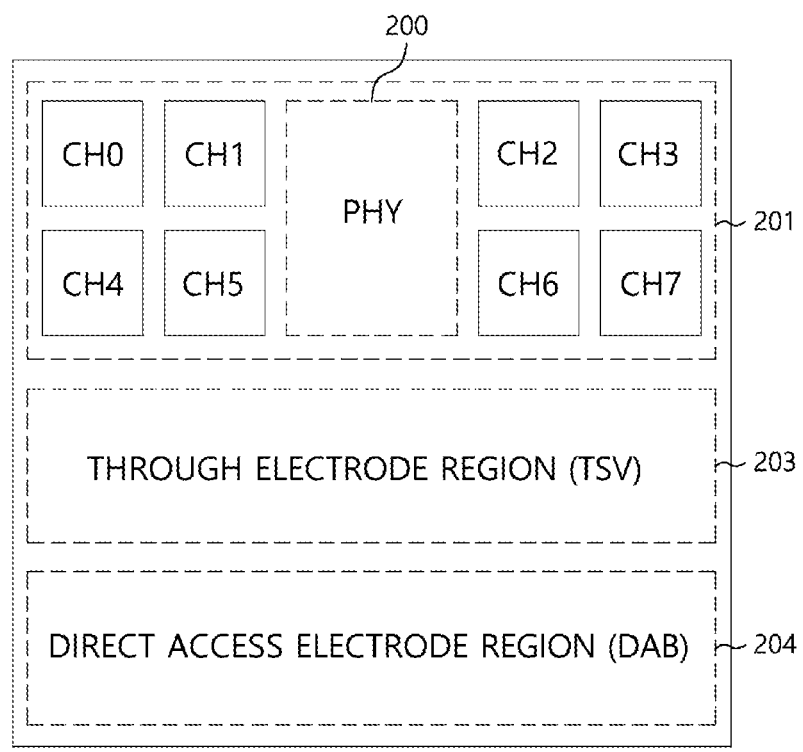
FIG. 2 is a plan view illustrating a base die of FIG. 1.

As illustrated in FIG. 2, the base die 200 may include a channel regions 201, a physical region 202, a through electrode region 203, and a direct access electrode region 204.

The channel region 201 may be a region for interfacing with memory channels formed by the plurality of core dies.

When the plurality of core dies 300 (shown in FIG. 3) in the stack type semiconductor memory 101 form 8 channels, for example, CH0 to CH7, the channel region 201 may refer to a channel region formed in the base die 200.

Each of the plurality of core dies 300 may form two channels.

The physical region 202 may be a region in which input/output (I/O)-related circuits for interfacing with the memory controller CPU or GPU of FIG. 1 are formed.

The through electrode region 203 may include the plurality of through electrodes TSV.

The direct access electrode region 204 may include a plurality of direct access balls (DABs) for allowing an external apparatus, for example, the memory controller or test equipment to perform testing by directly accessing (for example, probing) the stack type semiconductor memory 101 in a way other than through the interposer.

A test of the stack type semiconductor memory 101 according to an embodiment may be performed by allowing the stack type semiconductor memory 101 to enter any one of various test modes, and allowing the stack type semiconductor memory 101 to perform general operations such as a read operation, a write operation, a precharge operation, or an active operation according to the corresponding test mode.

The stack type semiconductor memory 101 according to an embodiment may be configured to improve a degree of integration of the core die 300 by arranging both a command processing circuit and a test mode signal generation circuit in the base die 200. The degree of integration of the core die 300 may also be improved by arranging only the test mode signal generation circuit in the plurality of core dies 200 and transmitting signals generated in the command processing circuit of the base die 200 to the core dies 300 using the through electrodes TSV.

The command processing circuit may be a decoder configured to decode source signals for test mode setup provided from the outside (for example, the test equipment or the memory controller), for example, a mode register signal, a row address, a column address, and the like, and detailed description thereof will be made with reference to FIG. 3.

Figure 3:
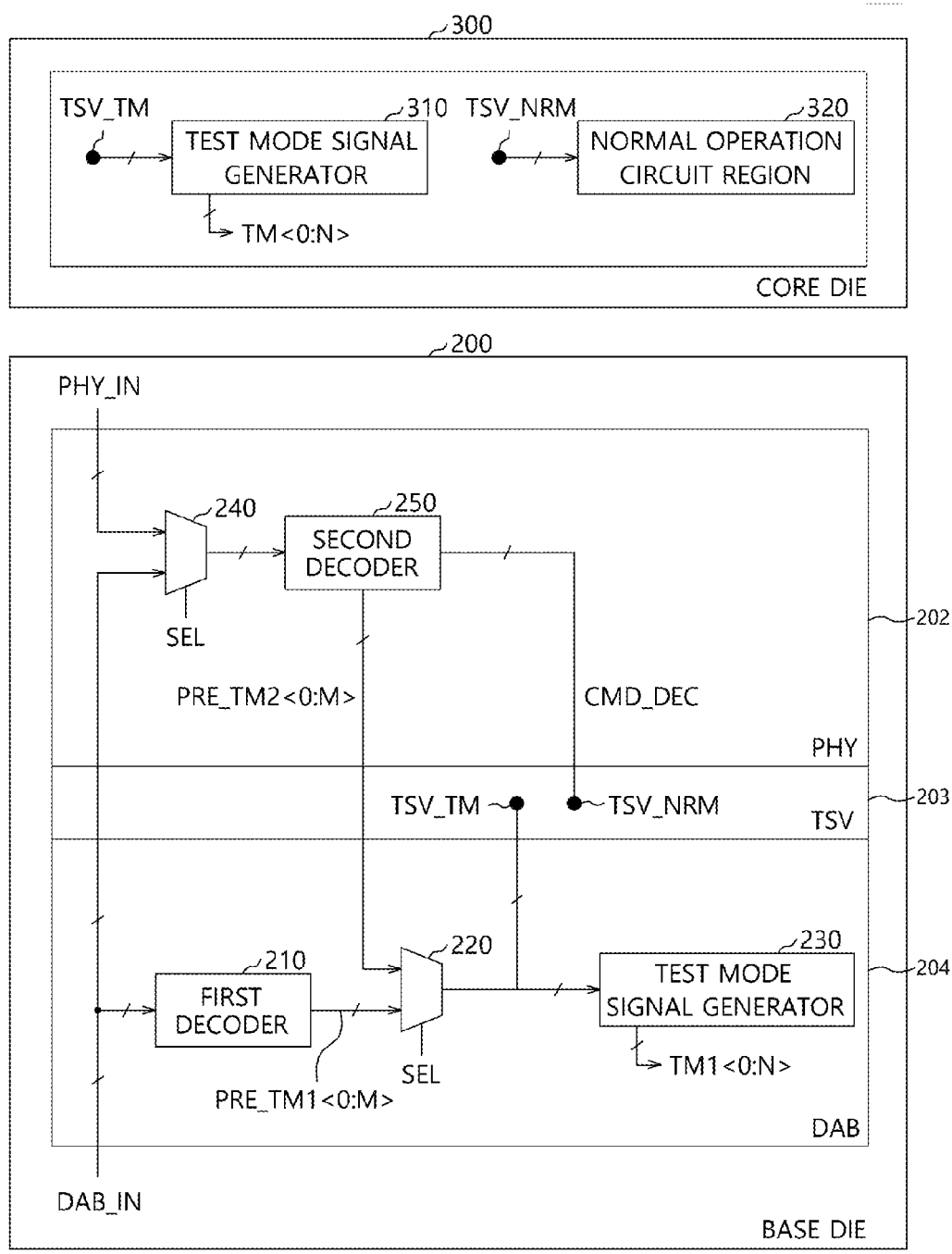
FIG. 3 is a plan view illustrating a stack type semiconductor memory of FIG. 1.

FIG. 3 is a diagram illustrating one among the plurality of core dies 300 and the base die 200 in the stack type semiconductor memory 101 of FIG. 1 when arranged in a plan for clarity.

As illustrated in FIG. 3, each of the plurality of core dies 300 may include a test mode signal generator 310 as the test mode signal generation circuit.

The test mode signal generator 310 of one or more of the core dies 300 may generate test mode signals TM<0: N> according to signals transmitted through a through electrode array for a test mode TSV_TM.

The core die 300 may enter any one among various test modes according to the test mode signals TM<0:N>.

The core die 300 may further include a normal operation circuit region 320.

The normal operation circuit region 320 may perform general operations such as a read operation, a write operation, a precharge operation, or an active operation according to the signals transmitted through a normal through electrode array TSV_NRM.

The base die 200 may include a first decoder 210, a first multiplexer 220, a test mode signal generator 230, a second multiplexer 240, and a second decoder 250.

The first decoder 210, the first multiplexer 220, and the test mode signal generator 230 may be arranged in the direct access electrode region 204 of the base die 200.

The second multiplexer 240 and the second decoder 250 may be arranged in the physical region 202 of the base die 200.

The through electrode region 203 may include the through electrode array for a test mode TSV_TM and the normal through electrode array TSV_NRM.

Among the plurality of through electrodes TSV, the through electrode array for a test mode TSV_TM may include through electrodes allocated for test mode-related signals, and the normal through electrode array TSV_NRM may include through electrodes allocated for normal operation-related signals.

The source signals for test mode setup, for example, at least one of a mode register signal, a row address, a column address, and the like may be input through the direct access electrode region 204 or the physical region 202 from outside the stacked dies. Hereinafter, for clarity, the source signals input through the direct access electrode regions 204 may be referred to as a first input signal DAB_IN, and the source signals input through the physical region 202 may be referred to as a second input signal PHY_IN.

The first decoder 210 of the stack type semiconductor memory 101 may generate first preliminary test mode signals PRE_TM1<0:M> by decoding the first input signal DAB_IN input through the plurality of direct access balls DAB in the direct access electrode region 204.

The first input signal DAB_IN may include at least one among a mode register signal, a row address, and a column address.

The first decoder 210 may include a mode register set (MRS) decoder.

The first multiplexer 220 may select the first preliminary test mode signals PRE_TM1<0:M> or second preliminary test mode signals PRE_TM2<0:M> according to an input mode selection signal SEL and output the selected preliminary test mode signals to one or more of the core dies 300 through the through electrode region 203.

An output of the first multiplexer 220 may be transmitted to one or more dies comprising the core die 300 through the through electrode array for a test mode TSV_TM.

The test mode signal generator 230 may generate the test mode signals TM<0:N> according to output of the first multiplexer 220.

The base die 200 may enter any one among the various test modes according to the test mode signals TM<0:N>.

The second multiplexer 240 may select the first input signal DAB_IN input through the direct access electrode region 204 or the second input signal PHY_IN input through the physical region 202 according to the input mode selection signal SEL, and output selected source signal(s).

The second input signal PHY_IN may include at least one among a mode register signal, a row address, and a column address.

The second decoder 250 of the stack type semiconductor memory 101 may activate and provide the second preliminary test mode signals PRE_TM2<0:M> or command decoding signals CMD_DEC by decoding an output signal of the second multiplexer 240.

The second decoder 250 may include a mode register set (MRS) decoder, a row address decoder, and a column address decoder.

The second decoder 250 may activate the second preliminary test mode signals PRE_TM2<0:M> and the command decoding signals CMD_DEC when the second input signal PHY_IN is the mode register signal, where the second input signal PHY_IN may be provided from outside the plurality of stacked dies.

The second decoder 250 may activate the command decoding signals CMD_DEC of the second preliminary test mode signals PRE_TM2<0:M> and the command decoding signals CMD_DEC when the second input signal PHY_IN is the row address and/or the column address.

The command decoding signals CMD_DEC output from the second decoder 250 may be transmitted to one or more dies comprising the core die 300 through the normal through electrode array TSV_NRM for a normal operation.

A test operation of the semiconductor system 100 having the above-described configuration according to an embodiment will be described.

The semiconductor system 100 according to an embodiment may enable a test of the core die 300 by providing the source signals for test mode setup, for example, the mode register signal, the row address, the column address, and the like only to the base die 200. The semiconductor system will not, however, enable a test of the core die 300 by directly providing the source signals for test mode setup to the core die 300.

An example of the semiconductor system 100 after packaging is shown in FIG. 1. The semiconductor system 100 before packaging may enable a test by directly accessing the stack type semiconductor memory 101 through the direct access electrode region 204 as illustrated in FIG. 2.

That is, the stack type semiconductor memory 101 of FIG. 3 may be configured to enable a test through both the direct access electrode region 204 and the physical region 202.

A method of testing the core die 300 using the direct access electrode region 204 of the base die 200 will be described.

In a first input mode in which the first input signal DAB_IN is provided through the direct access electrode region 204, the input mode selection signal SEL may have a value allowing the first multiplexer 220 to select and output the output of the first decoder 210.

The stack type semiconductor memory 101 may provide the first input signal DAB_IN from the outside through the direct access electrode region 204.

The first decoder 210 may generate the first preliminary test mode signals PRE_TM1<0:M> by decoding the first input signal DAB_IN.

The first preliminary test mode signals PRE_TM1<0:M> may be input to the test mode signal generator 310 of the core die 300 through the through electrode array for a test mode TSV_TM in the through electrode region 203 via the first multiplexer 220.

The test mode signal generator 310 of the core die 300 may allow the core die 300 to enter the determined test mode by generating the test mode signals TM<0:N> according to the first preliminary test mode signals PRE_TM1<0:M>.

A method of testing the core die 300 using the physical region 202 of the base die 200 will be described.

In a second input mode in which the second input signal PHY_IN is provided through the physical region 202, the input mode selection signal SEL may have a value for allowing the first multiplexer 220 to select and output the output of the second decoder 250 and for allowing the second multiplexer 240 to select and output the second input signal PHY_IN.

The stack type semiconductor memory 101 may provide the second input signal PHY_IN input from the outside through the physical region 202.

The second multiplexer 240 may select the second input signal PHY_IN according to the input mode selection signal SEL and provide the selected second input signal PHY_IN to the second decoder 250.

The second decoder 250 may generate the second preliminary test mode signals PRE_TM2<0:M> by decoding the second input signal PHY_IN.

The generation of the second preliminary test mode signals PRE_TM2<0:M> may mean that any one of or more signal bits among the second preliminary test mode signals PRE_TM2<0:M> are output having a different level than the remaining signal bits.

The second preliminary test mode signals PRE_TM2<0:M> may be input to the test mode signal generator 310 of the core die 300 through the through electrode array for a test mode TSV_TM of the through electrode region 203 via the first multiplexer 220.

The test mode signal generator 310 of the core die 300 may allow the core die 300 to enter the determined test mode by generating the test mode signals TM<0:N> according to the second preliminary test mode signals PRE_TM2<0:M>.

As described above, after the test mode setup is performed, the first input signal DAB_IN may be provided through the direct access electrode region 204 or the second input signal PHY_IN may be provided through the physical region 202, and thus the stack type semiconductor memory 101 may perform operations according to the currently entered test mode. For example, the stack type semiconductor memory 101 may perform an active operation, a read operation, a write operation, and the like.

When the first input signal DAB_IN or the second input signal PHY_IN including the row address and/or the column address is provided, the second decoder 250 may selectively activate the signal bits of the command decoding signals CMD_DEC.

The command decoding signals CMD_DCE output from the second decoder 250 may be transmitted to the normal operation circuit region 320 of the core die 300 through the normal through electrode array TSV_NRM for a normal operation.

The normal operation circuit region 320 may perform the test according to the currently entered test mode by performing operations corresponding to the command decoding signals CMD_DEC transmitted through the normal through electrode array TSV_NRM. In one example, operations may include general operations such as a read operation, a write operation, and the active operation.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

The semiconductor system 100 discussed above (see FIGS. 1-3) are particularly useful in the design of memory devices, processors, and computer systems. For example, referring to FIG. 4, a block diagram of a system employing a semiconductor system 100 in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system 100 as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system 100 as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor system according to FIGS. 1-3. In alternate embodiments, such as, for example but not limited to, cellular phones or digital cameras, the components may differ from the embodiments illustrated in FIG. 4.

Figure 4:
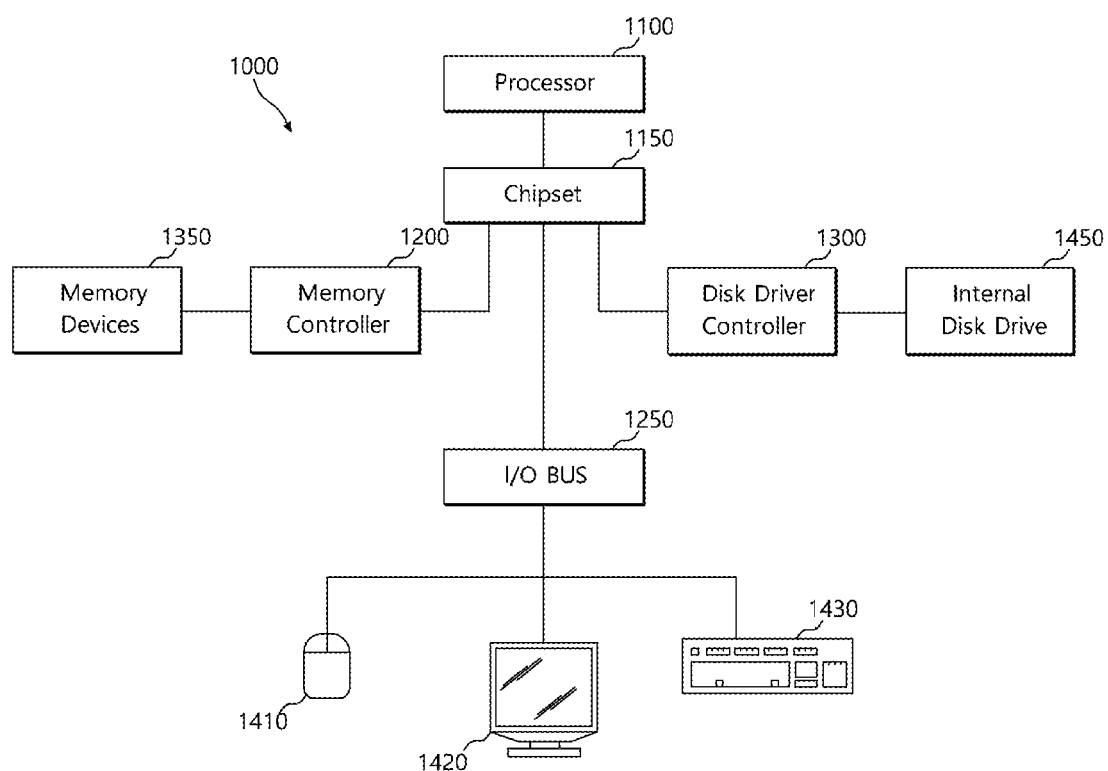
FIG. 4 illustrates a block diagram of an example of a representation of a system employing a semiconductor device in accordance with the various embodiments discussed above with relation to FIGS. 1-3.

FIG. 4 illustrates a block diagram of an example of a representation of a system employing semiconductor system 100 in accordance with the various embodiments discussed above with relation to FIGS. 1-3.

What is claimed is:
1. A stack type semiconductor memory comprising:
   a plurality of stacked dies configured to transmit signals through a plurality of through electrodes,
   wherein only one die of the plurality of stacked dies comprises a decoder,
   wherein the one die is configured to provide preliminary test mode signals generated by decoding a row address and a column address provided from outside the plurality of stacked dies through a direct access electrode region or a physical region using the decoder, to other dies through the plurality of through electrodes, and
   the other dies are configured to generate test mode signals according to the preliminary test mode signals transmitted through the plurality of through electrodes.
2. The stack type semiconductor memory of claim 1, wherein the plurality of stacked dies include a base die and a plurality of core dies.
3. The stack type semiconductor memory of claim 2, wherein the one die is the base die, and the other dies are the plurality of core dies.
4. The stack type semiconductor memory of claim 1, wherein the preliminary test mode signals are generated according to the source signals for test mode setup provided from the outside of the plurality of stacked dies.

5. The stack type semiconductor memory of claim 1, wherein the one die includes the direct access electrode region, the physical region, and a through electrode region.

6. The stack type semiconductor memory of claim 5, wherein the direct access electrode region includes:
   a first decoder configured to generate first preliminary test mode signals by decoding source signals input through the direct access electrode region; and
   a first multiplexer configured to select the first preliminary test mode signals or second preliminary test mode signals according to an input mode selection signal and output the selected preliminary test mode signals to the other dies through the through electrode region.

7. The stack type semiconductor memory of claim 6, wherein the direct access electrode region further includes a test mode signal generator configured to generate the test mode signals according to an output of the first multiplexer.

8. The stack type semiconductor memory of claim 6, wherein the physical region includes:
   a second multiplexer configured to select the source signals input through the direct access electrode region or source signals input through the physical region according to the input mode selection signal and output the selected source signals; and
   a second decoder configured to generate the second preliminary test mode signals by decoding an output of the second multiplexer.

9. The stack type semiconductor memory of claim 8, wherein the second decoder is configured to generate command decoding signals for an normal operation and transmit the generated command decoding signals to the other dies through the through electrode region according to the output of the second multiplexer.

10. A stack type semiconductor memory comprising:
   a stacked base die and core die configured to transmit signals through a plurality of through electrodes,
   wherein only the base die comprises a decoder,
   wherein the base die is configured to provide preliminary test mode signals generated by decoding a row address and a column address provided from outside of the stacked base die and core die through a direct access electrode region or a physical region using the decoder, to the core die through the plurality of through electrodes, and
   the core die is configured to generate test mode signals according to the preliminary test mode signals transmitted through the plurality of through electrodes and allow a test mode corresponding to the test mode signals to be set.

11. The stack type semiconductor memory of claim 10, wherein the direct access electrode region includes:
   a first decoder configured to generate first preliminary test mode signals by decoding the source signals input through the direct access electrode region; and
   a first multiplexer configured to select the first preliminary test mode signals or second preliminary test mode signals according to an input mode selection signal and output the selected preliminary test mode signals to the core die through a through electrode region.

12. The stack type semiconductor memory of claim 11, wherein the direct access electrode region further includes a test mode signal generator configured to generate the test mode signals according to an output of the first multiplexer.

13. The stack type semiconductor memory of claim 12, wherein the physical region includes:
   a second multiplexer configured to select the source signals input through the direct access electrode region or the source signals input through the physical region according to the input mode selection signal and output the selected source signals; and
   a second decoder configured to generate the second preliminary test mode signals by decoding an output of the second multiplexer.

14. The stack type semiconductor memory of claim 13, wherein the second decoder is configured to generate command decoding signals for an normal operation and transmit the generated command decoding signals to the core die through the through electrode region according to the output of the second multiplexer.

15. A semiconductor system comprising:
   a memory controller; and
   a stack type semiconductor memory coupled to the memory controller through an interposer and including a plurality of dies,
   wherein only the base die comprises a decoder,
   wherein the one die is configured to provide preliminary test mode signals generated by decoding a row address and a column address input through a direct access electrode region or a physical region using the decoder, to other dies through the plurality of through electrodes, and
   the other dies are configured to generate test mode signals according to the preliminary test mode signals transmitted through the plurality of through electrodes and allow a test mode corresponding to the test mode signals to be set.

16. The semiconductor system of claim 15, wherein the direct access electrode region includes:
   a first decoder configured to generate first preliminary test mode signals by decoding the source signals input through the direct access electrode region; and
   a first multiplexer configured to select the first preliminary test mode signals or second preliminary test mode signals according to an input mode selection signal and output the selected preliminary test mode signals to the other dies through a through electrode region.

17. The semiconductor system of claim 16, wherein the physical region includes:
   a second multiplexer configured to select the source signals input through the direct access electrode region or the source signals input through the physical region according to the input mode selection signal and output the selected source signals; and
   a second decoder configured to generate the second preliminary test mode signals by decoding an output of the second multiplexer.

18. The semiconductor system of claim 17, wherein the second decoder is configured to generate command decoding signals for a normal operation and transmit the generated command decoding signals to the other dies the through electrode region.

* * * * *